US010118386B2

(12) United States Patent
Hitzlsperger et al.

(10) Patent No.: US 10,118,386 B2
(45) Date of Patent: Nov. 6, 2018

(54) METHOD TO ACTIVATE A NOZZLE ARRANGEMENT OF AN INKJET PRINTING SYSTEM

(71) Applicant: Océ Holding B.V., Venlo (NL)

(72) Inventors: Florian Hitzlsperger, Munich (DE); Benno Petschik, Markt Schwaben (DE)

(73) Assignee: Océ Holding B.V., Venlo (NL)

(*) Notice: Subject to any disclaimer, the term of this patent is extended or adjusted under 35 U.S.C. 154(b) by 0 days.

(21) Appl. No.: 15/410,911

(22) Filed: Jan. 20, 2017

(65) Prior Publication Data

US 2017/0203564 A1 Jul. 20, 2017

(30) Foreign Application Priority Data

Jan. 20, 2016 (DE) ........................ 10 2016 100 892

(51) Int. Cl.
*B41J 29/38* (2006.01)
*B41J 2/045* (2006.01)

(52) U.S. Cl.
CPC ....... *B41J 2/04588* (2013.01); *B41J 2/04573* (2013.01); *B41J 2/04581* (2013.01); *B41J 2/04586* (2013.01); *B41J 2/04593* (2013.01); *H05K 999/99* (2013.01)

(58) Field of Classification Search
USPC ............................................ 347/5, 9, 10, 11
See application file for complete search history.

(56) References Cited

U.S. PATENT DOCUMENTS

| | | | | |
|---|---|---|---|---|
| 2005/0083359 | A1* | 4/2005 | Tamura | B41J 2/04541 347/10 |
| 2010/0188450 | A1 | 7/2010 | Fujii | |
| 2010/0238218 | A1 | 9/2010 | Matsushita et al. | |
| 2011/0063351 | A1 | 3/2011 | Kitaoka | |
| 2013/0100191 | A1 | 4/2013 | Miyamoto et al. | |

FOREIGN PATENT DOCUMENTS

| | | | |
|---|---|---|---|
| EP | 0976558 | A2 | 2/2000 |

* cited by examiner

*Primary Examiner* — Lam Nguyen
(74) *Attorney, Agent, or Firm* — Schiff Hardin LLP

(57) ABSTRACT

A method for printing waveforms, such as overlong waveforms, can be used to enable the printing of large ink droplets. The method can include determining whether the first waveform is longer than the duration and inducing the continued activation of a nozzle arrangement with the first waveform at a second activation point in time based on the determination that the first waveform is longer than the duration. The method can include the suppression of a new activation of the nozzle arrangement to ensure the execution of the first waveform (e.g., an overlong waveform).

20 Claims, 2 Drawing Sheets

METHOD TO ACTIVATE A NOZZLE ARRANGEMENT OF AN INKJET PRINTING SYSTEM

CROSS REFERENCE TO RELATED APPLICATIONS

This patent application claims priority to German Patent Application No. 102016100892.3, filed Jan. 20, 2016, which is incorporated herein by reference in its entirety.

BACKGROUND

The present disclosure is directed to methods to activate a print head (e.g., to activate a nozzle arrangement of a print head) of an inkjet printing system.

Inkjet printing systems may be used to print to recording media (such as paper, for example). For this, a plurality of nozzle arrangements may be used to fire or push ink droplets onto the recording medium, and thus to generate a desired print image on the recording medium.

A nozzle arrangement may be configured to eject ink droplets with different droplet sizes. This can be particularly advantageous for the rendering of half tones. The actuator of a nozzle arrangement is typically activated with a specific waveform to induce the nozzle arrangement to eject an ink droplet with a specific droplet size. For the most part, the chronological length of the waveform thereby increases with increasing droplet size.

United States Patent Application Publication No. 2011/0063351A1 describes an inkjet printing system in which waveforms for different droplet sizes are composed of one or more basic shapes. A maximum possible droplet size thereby results via combination of a maximum number of basic shapes.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
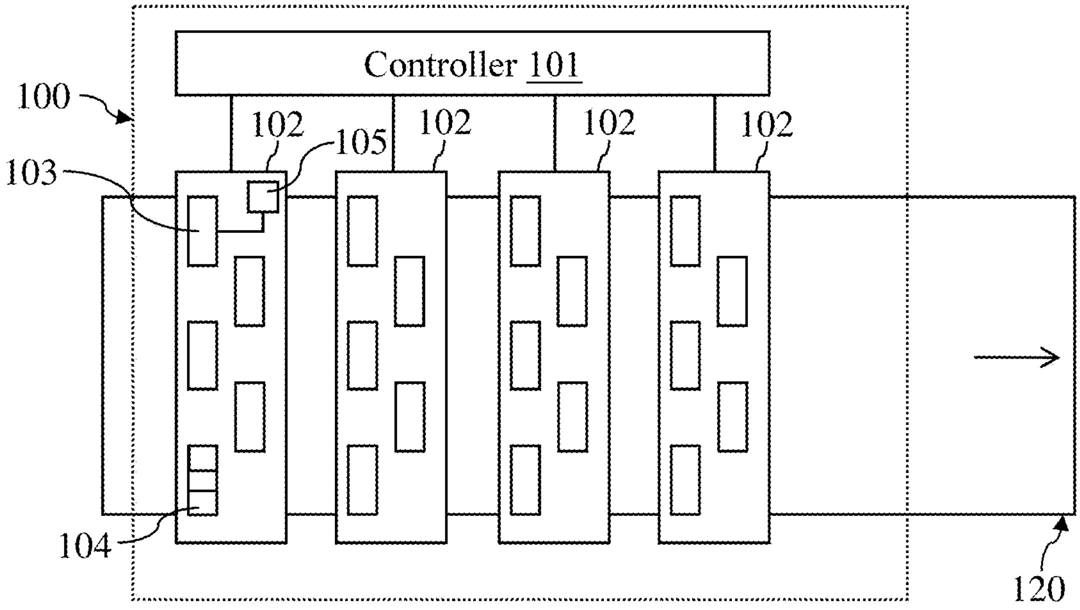
FIG. 1 illustrates a block diagram of an inkjet printing system according to an exemplary embodiment of the present disclosure.

The exemplary embodiments of the present disclosure will be described with reference to the accompanying drawings.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

An object of the present disclosure is to provide a method and corresponding control device (e.g., controller) for an inkjet printing system, via which method and control device, the maximum size of ink droplets that may be printed by the nozzle arrangement of an inkjet printing system may be increased (e.g., compared to conventional systems).

An exemplary embodiment of the present disclosure includes a method for activating a nozzle arrangement (e.g., a nozzle arrangement of an inkjet printing system). In operation, a recording medium can be printed to and the nozzle arrangement are thereby moved relative to one another in a transport direction. In an exemplary embodiment, the method includes the activation of a nozzle arrangement at a sequence of activation points in time to print a corresponding sequence of pixels of a column of a print image in the transport direction onto the recording medium. In an exemplary embodiment, a time interval between a first activation point in time and a subsequent second activation point in time of the sequence of activation points in time thereby corresponds to a time duration. The time duration may thereby correspond to the time period between the printings of two lines of the print image in direct succession. In an exemplary embodiment, the method includes the determination that the nozzle arrangement should be activated with a first waveform at the first activation point in time. In an exemplary embodiment, the method includes the determination that the first waveform is longer than the time duration. Furthermore, in an exemplary embodiment, the method includes the inducement that the activation of the nozzle arrangement with the first waveform is continued at the second activation point in time.

An exemplary embodiment can include a controller of, for example, a nozzle arrangement. A recording medium and a nozzle arrangement are thereby moved relative to one another in a transport direction. In an exemplary embodiment, the controller can be configured to activate the nozzle arrangement at a sequence of activation points in time to print a corresponding sequence of pixels of a column of a print image in the transport direction onto the recording medium. In an exemplary embodiment, a time interval between a first activation point in time and a second activation point in time corresponds to the sequence of activation points in time. In an exemplary embodiment, the controller can be configured to determine that the nozzle arrangement should be activated with a first waveform at the first activation point in time. In an exemplary embodiment, controller can be configured to determine the length of a waveform with respect to the time duration, including that the first waveform is longer than the time duration. In an exemplary embodiment, the controller can be configure to induce the activation of the nozzle arrangement with the first waveform to be continued at the second activation point in time.

An exemplary embodiment includes an inkjet printing system that comprises the controller according to one or more exemplary embodiments of the present disclosure.

FIG. 1 illustrates a block diagram of an inkjet printing system 100 according to an exemplary embodiment of the present disclosure. In an exemplary embodiment, the printing system 100 in FIG. 1 is configured to print to a web-shaped recording medium 120 (also designated as a "continuous feed"), but is not limited thereto. For example, the printing system 100 can be configured to print to, for example, a page- or sheet-shaped recording media 120. A web-shaped recording medium 120 is typically unspooled from a roll (the take-off) and then supplied to the print group of the printing system 100. A print image is applied to the recording medium 120 via the print group, and after fixing/drying of the print image the printed recording medium 120 is taken up again on an additional roll (the take-up) or cut into sheets. In FIG. 1, the transport direction of the recording medium 120 is represented by an arrow. The recording medium 120 may be produced from, for example, paper, paperboard, cardboard, metal, plastic, textiles and/or other suitable and printable materials as would be understood by one of ordinary skill in the relevant arts.

In an exemplary embodiment, as illustrated in FIG. 1, the print group of the printing system 100 comprises four print head arrangements 102 (that are also respectively designated as print bars), but is not limited thereto. The different print head arrangements 102 may be configured to print with inks of different colors (for example black, cyan, magenta and/or yellow). The print group may comprise additional (or less) print head arrangements 102 for printing with additional colors or additional inks (for example MICR ink). That is, the printing system 100 can include any number of print head arrangements 102.

In an exemplary embodiment, a print head arrangement 102 comprises one or more print heads 103. As shown in FIG. 1, a print head arrangement 102 comprises five respective print heads 103, but is not limited thereto. Each print head 103 may possibly in turn be subdivided into a plurality of print head segments 104, wherein each print head segment 104 comprises one or more nozzles or, respectively, nozzle arrangements.

The installation position/orientation of a print head 103 within a print head arrangement 102 may depend on the type of print head 103. Each print head 103 comprises multiple nozzles or nozzle arrangements that may be arranged in different segments 104, wherein each nozzle is set up to fire or eject ink droplets onto the recording medium 120. For example, a print head 103 may comprise 2558 effectively utilized nozzles that are arranged along multiple rows transversal to the transport direction of the recording medium 120. The nozzles in the individual rows are arranged offset from one another. A respective line on the recording medium 120 may be printed transversal to the travel direction by means of the nozzles of a print head 103. The nozzles from different rows are thereby activated with a slight time offset from one another in order to compensate for the spatial offset of the different nozzle rows, and in order to thus be able to print a line (i.e. in particular a straight line) transversal to the transport direction at an activation point in time. An increased resolution may be provided via the use of a plurality of rows with (transversally offset) nozzles. In total, K=12790 droplets may thus be sprayed onto the recording medium 120 along a transversal line by a print head arrangement 102 depicted in FIG. 1 (for example for a print width of approximately 21.25 inches with 600 dpi (dots per inch)). In other words, a print head arrangement 102 may comprise K (for example K=12790) nozzles for printing of a line (or transversal line) of a print image. Each print head arrangement 102 may thus be set up to print a complete transversal line of a defined color (with K pixels) on the recording medium 120 as needed.

In an exemplary embodiment, the printing system 100 comprises a controller 101 that is configured to activate the actuators of the individual nozzle arrangements of the individual print heads 103 to apply a print image onto the recording medium 120 (e.g., based on print data). In an exemplary embodiment, print data rastered and possibly screened for a print image may be provided by the controller 101, which print data indicates whether an ink ejection should take place (e.g., for every pixel), and/or what droplet size should be ejected. In an exemplary embodiment, the controller 101 includes processor circuitry that is configured to perform one or more functions and/or operations of the controller 101, including the activation of the actuator(s).

In an exemplary embodiment, the printing system 100 includes a controller 105 for a print head arrangement 102 and/or for a print head 103. For example, the controller 105 comprises one or more Field Programmable Gate Arrays (FPGAs). In an exemplary embodiment, the controller 105 can be configured to activate the individual nozzle arrangements 200 based on the print data. In an exemplary embodiment, one controller 105 may be provided for a plurality of print heads 103 (e.g., for all print heads 103) of a print head arrangement 102, or one or more of the print heads 103 may have a corresponding controller 105. In an exemplary embodiment, the controller 105 includes processor circuitry that is configured to perform one or more functions and/or operations of the controller 105, including the activation of the actuator(s).

In an exemplary embodiment, a control system (not shown in FIG. 1) may be provided for the printing system 100. The control system can be configured to control workflows, for example, a travel of the recording medium 120 and/or a management of the ink (in particular of the ink reservoir). In an exemplary embodiment, the control system includes processor circuitry that is configured to perform one or more functions and/or operations of the control system.

In an exemplary embodiment, the printing system 100 comprises K nozzle arrangements that may be activated with a defined activation frequency (i.e. with a defined line clock) in order to print a line (transversal to the transport direction of the recording medium 120) with K pixels or K columns on the recording medium 120. The activation frequency thereby depends on the print speed (number of printed lines per time unit) of the printing system 100. In particular, a line clock may respectively be triggered if the recording medium 120 has continued forward by precisely the interval of two directly successive lines. This means that the line clock may be repeatedly triggered via the forward movement of the recording medium 120. Given a constant print speed, a constant time duration thereby results between two successive lines.

In an exemplary embodiment, the nozzle arrangements 200 are immovably or firmly plugged into the printing system 100, and the recording medium 120 is directed at a specific transport velocity past the stationary nozzle arrangements 200. A specific nozzle arrangement 200 thus prints a correspondingly determined column (in the transport direction) onto the recording medium 120 (in a one-to-one association). The nozzle arrangement 200 of a print head 103 may thus be activated at most once per line of a print image (i.e. per line clock) in order to produce an ink ejection if necessary. In one or more other embodiments, the nozzle arrangements 200 are configured to move relative to a moving or stationary recording medium 120.

Figure 2:
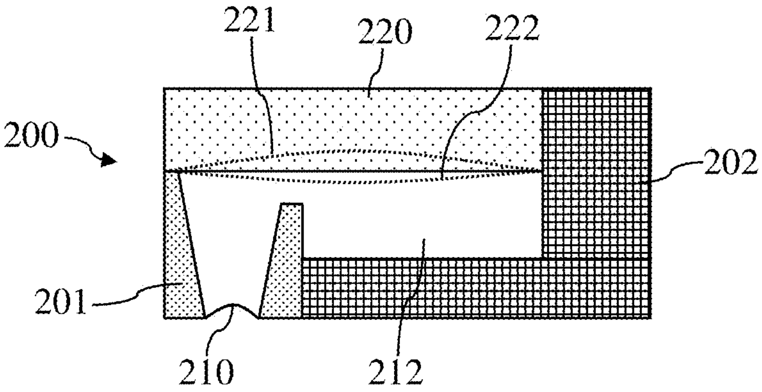
FIG. 2 illustrates an inkjet nozzle arrangement according to an exemplary embodiment of the present disclosure.

FIG. 2 illustrates a nozzle arrangement 200 of a print head 103 according to an exemplary embodiment of the present disclosure. In an exemplary embodiment, the nozzle arrangement 200 comprises walls 202 which, together with an actuator 220 and a nozzle 201, form a receptacle or chamber 212 to receive ink. An ink droplet may be sprayed or pushed onto the recording medium 120 via the nozzle 201 of the nozzle arrangement 200. The ink forms what is known as a meniscus 210 at the nozzle 201. In an exemplary embodiment, the nozzle arrangement 200 comprises an actuator 220 (for example a piezoelectric element) that is set up to vary the volume of the chamber 212 to receive ink or, respectively, to vary the pressure in the chamber 212 of the nozzle arrangement 200. In particular, the volume of the chamber 212 may be reduced, and the pressure in the chamber 212 may thus be increased, by the actuator 220 as a result of a deflection 222. An ink droplet is thus pushed out of the nozzle arrangement 200 via the nozzle 201. FIG. 2 shows a corresponding deflection 222 (dotted line) of the actuator 220. Moreover, the volume of the chamber 212 may be increased via the actuator 220 (see deflection 221) in order to draw new ink into the receptacle or chamber 212 via an inlet (not shown in FIG. 2).

In an exemplary embodiment, the ink 212 within the nozzle arrangement 200 may be moved, and the chamber 212 may be put under pressure, via a deflection 221, 222 of the actuator 220. A defined movement of the actuator 220 thereby produces a correspondingly defined movement of the ink. In an exemplary embodiment, the defined movement of the actuator 220 is produced via a corresponding waveform and/or a corresponding specific pulse of an activation signal of the actuator 220. In an exemplary embodiment, via a fire pulse (also designated as an ejection pulse or ejection waveform) to activate the actuator 220, the nozzle arrangement 200 ejects an ink droplet via the nozzle 201. Different ink droplets may be ejected via different activation signals to the actuator 220. In an exemplary embodiment, the ink droplets may be ejected with different droplet size (for example 5 pl, 7 pl or 12 pl). In an exemplary embodiment, via a prefire pulse (also designated as a pre-ejection pulse or pre-ejection waveform) for activation of the actuator 220, no ink droplet is thereby ejected via the nozzle 201 even though the nozzle arrangement 200 produces a movement of the ink and an oscillation of the meniscus 210.

As described above, the present disclosure includes embodiments that include the printing of ink droplets with an optimally large droplet size. In print image generation, differently sized droplet sizes may be used to increase the print quality (via what is known as a multilevel activation). Advantages thereby result in particular in the reproduction of half tones by means of half tone rastering. For example, the use of small droplet sizes for generation of surface elements with relatively low levels of inking and optimally low print image granularity may be reasonable. For high levels of inking, large droplet sizes are typically used in order to be able to transfer the ink quantity necessary for a complete surface coverage onto the recording medium 120.

In an exemplary embodiment, the nozzle arrangements 200 include a piezoelectric actuator 220. The droplet size can be determined via the shape and the time length of the waveform (also designated as an activation voltage pulse sequence, or pulse for short) for activation of the actuator 220. Larger ink droplets thereby typically require longer waveforms.

In an exemplary embodiment, a print head 103, or a print bar 102, are activated with a specific frequency (i.e. with a specific line clock) to activate the respective nozzle arrangements 120 for ejection of an ink droplet according to the activation frequency. In an exemplary embodiment, the activation frequency (i.e. the line clock for lines in direct succession) depends on the actual transport velocity and on the desired resolution in the transport direction of the recording medium 120. For this, the individual nozzle arrangements 200 are activated at the sequence of activation points in time, wherein the activation points in time chronologically follow one another according to the activation frequency. In an exemplary embodiment, the time interval between two activation points in time thereby corresponds to a (possibly constant) duration (in particular a period duration) that corresponds to the inverse value of the activation frequency.

Figure 3:
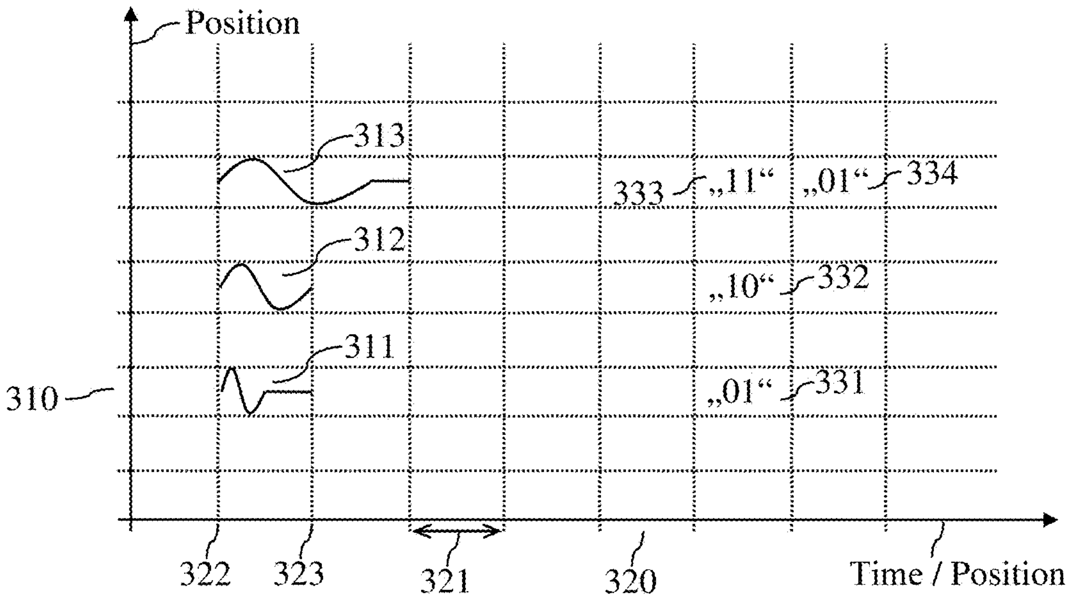
FIG. 3 illustrates examples waveforms and print data for activating the nozzle arrangements of a print head according to an exemplary embodiment of the present disclosure.

FIG. 3 illustrates the print data for a plurality of columns 310 (as a function of time or as a function of the position in the transport direction) and for a plurality of lines 320 (as a function of the position transversal to the transport direction) according to an exemplary embodiment of the present disclosure. FIG. 3 shows the period duration 321 between two activation points in time 322, 323. In an exemplary embodiment, the period duration 321 depends on the transport velocity of the recording medium 120. The period duration 321 is available for the printing of a line 320 of a print image with a plurality of columns 310.

FIG. 3 shows different waveforms 311, 312 (in simplified presentation) of different duration that may be used for the ejection of ink droplets with different droplet sizes. In an exemplary embodiment, the maximum possible duration for a waveform 311, 312 is limited by the period duration 321. In particular, the execution of a waveform 311, 312 for a line typically ends before expiration of the period duration 321, and the execution of a waveform 311, 312 can take place for the line following this.

In an exemplary embodiment, a print image to be printed is typically rastered to determine print data to activate the nozzle arrangements 200 of a print head 103 or of a print bar 102. The print data for each nozzle arrangement 200 (i.e. for each column 310 of the print image) and for each line 320 of the print image thereby include a control data set 331, 332. In an exemplary embodiment, a control data set 331, 332 for a nozzle arrangement 200 and for a line 321 (i.e. for an activation point in time 322, 323) thereby indicate whether an ink ejection (for printing a "non-white" pixel) should take place via the nozzle arrangement 200, and—if applicable—what droplet size the ejected ink droplet should have. The waveform 311, 312 for activation of the actuator 220 of a nozzle arrangement 200 is thus indicated by the control data set 331, 332 (for example by means of a bit sequence of 2, 3 or more bits).

In an exemplary embodiment, the period duration 321 limits the maximum time length of a waveform 311, 312. As a result, the maximum possible droplet size is bounded by the period duration 321. This bounding represents a limitation with regard to the print quality that can be achieved via the printing system 100. For the printing of specific print images, it may be reasonable to also use droplets having a droplet size that may not be generated within the period duration 321 (predetermined by the print speed). For example, it may be advantageous to use particularly large ink droplets for intensive inking of a region of a print image.

In an exemplary embodiment, the ejection of ink droplets having a particularly large droplet size may be achieved via the use of a waveform 313 that has a time length that exceeds the period duration 321. In one or more exemplary embodiments, waveform 313 is designated as an overlong waveform. In an exemplary embodiment, the controller 101 can be configured to generate print data that include one or more control data sets 333 that indicate that an overlong waveform 313 should be used in a specific column 310 (e.g., by a specific nozzle arrangement 200) and in a specific line 320.

In an exemplary embodiment, the controller 105 for the specific nozzle arrangement 200 may then activate the actuator 220 of this specific nozzle arrangement 200 with the overlong waveform 313. In an exemplary embodiment, the controller 105 can be configured to ignore a directly following control data set 334 for the directly following line 320 of the same column 310. In particular, the one or more control data sets 334 may be ignored for the specific nozzle arrangement 200 until the end of the overlong waveform 313 is reached.

In an exemplary embodiment, the length of a waveform 313 for the printing of a pixel may thus also be longer than the (constant) period duration 321 predetermined by the trigger or activation frequency. In an exemplary embodiment, via the controller 105, it may thereby be ensured that the line trigger signal for clocking the nozzle arrangements 200 does not prevent the execution of an overlong waveform 313 by the actuator 220 of a nozzle arrangement 200, or have a disruptive influence on this. This may be achieved in particular in that no new trigger or no new waveform 311, 312 for a nozzle arrangement 200 is allowed as long as an overlong waveform 313 has not been completely executed.

In an exemplary embodiment, alternatively or additionally, a nozzle arrangement 200 may be configured to be activated at a trigger point in time with a NOP ("No Operation") waveform while an overlong waveform 313 is being executed. A NOP waveform leads to the situation that the actuator 220 of the nozzle arrangement 200 continues to be activated only with the pulse sequence from the overlong waveform 313, and other activation pulses are not superimposed. In an exemplary embodiment, the NOP waveform may be indicated by a special value (e.g., by a special bit sequence) of a control data set 331, 332. Within the scope of the data preparation (in particular given half tone rastering or via a dedicated filter function) it may be ensured that, during the execution of an overlong waveform 313 by a specific nozzle arrangement 200, this nozzle arrangement 200 is activated only with NOP waveforms.

Figure 4:
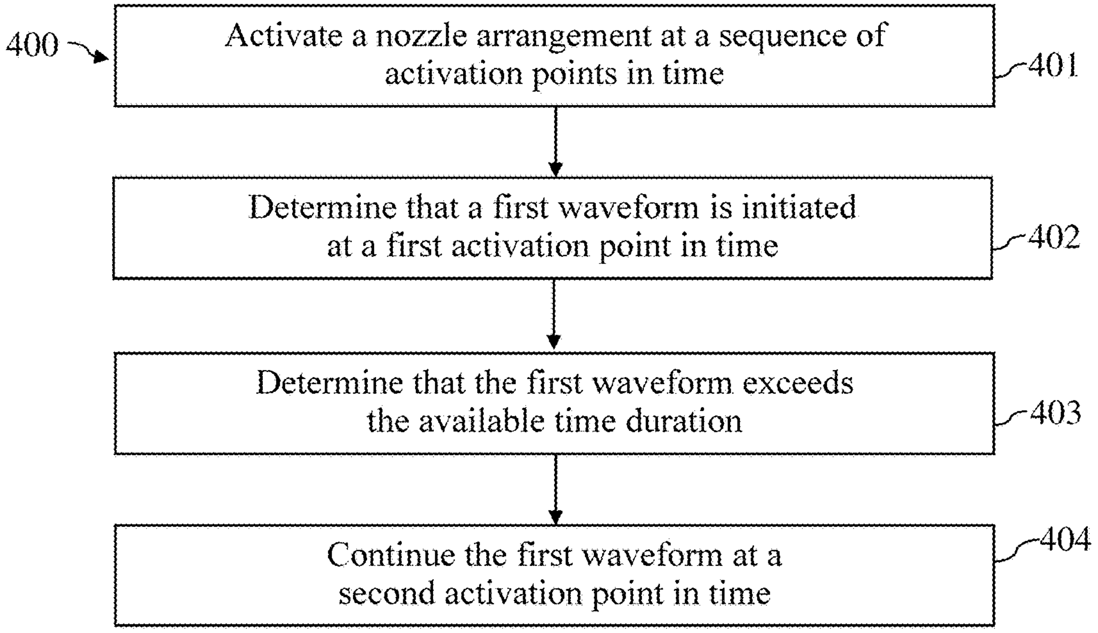
FIG. 4 illustrates a workflow of a method to activate the nozzle arrangement of an inkjet printing system according to an exemplary embodiment of the present disclosure.

FIG. 4 illustrates a workflow of a method 400 to activate a nozzle arrangement 200 (e.g., a nozzle arrangement 200 of an inkjet printing system 100) according to an exemplary embodiment of the present disclosure. In an exemplary embodiment, the inkjet printing system 100 comprises a plurality of nozzle arrangements 200 that may be arranged in one or more print heads 103 and/or in a print bar 102. A nozzle arrangement 200 can be configured to fire liquid (in particular ink) onto a recording medium 120 in order to print one or more pixels of a print image.

In an exemplary embodiment, the inkjet printing system 100 is configured such that a recording medium 120 and a nozzle arrangement 200 are moved relative to one another in a transport direction (with a specific relative velocity). In particular, the recording medium 120 may thereby be directed past the nozzle arrangement 200 (or past the plurality of nozzle arrangements 200) in the transport direction. The one or more nozzle arrangements 200 may thereby be stationary, meaning that the one or more nozzle arrangements 200 may be immobile relative to a housing or a frame of the inkjet printing system 100. Alternatively, the nozzle arrangement 200 may be moved relative to a moving (or stationary) recording medium 120.

In an exemplary embodiment, the method 400 includes the activation 401 of the nozzle arrangement 200 at a sequence of activation points in time 322, 323 to print a corresponding sequence of pixels of a column 310 of a print image onto the recording medium 120 in the transport direction. In an exemplary embodiment, a one-to-one relationship thereby exists between the nozzle arrangement and the column 310 (i.e., the nozzle arrangement 200 may print precisely one column 310 of the nozzle arrangement 200 in a one-to-one relationship). In an exemplary embodiment, the plurality of nozzle arrangements 200 may accordingly print a corresponding plurality of columns 310 of the print image, respectively in a one-to-one relationship. This may apply to all (or some) nozzle arrangements 200 of a print head 103 or of a print bar 102. In an exemplary embodiment, a nozzle arrangement 200 may thus be designed such that the nozzle arrangement 200 prints a pixel only at the activation points in time 322, 323. The print frequency of a nozzle arrangement 200 may thus be established by the activation points in time 322, 323.

In an exemplary embodiment, the time interval between a first activation point in time 322 and a (possibly directly) following second activation point in time 323 of the sequence of activation points in time 322, 323 corresponds to a specific duration 321. In an exemplary embodiment, the duration 321 may thereby be constant (at least for the time period that includes the sequence of activation points in time 322, 323). In an exemplary embodiment, the duration 321 can depend on the density of pixels in the transport direction in the print image (i.e. on the resolution of the print image in the transport direction). In an exemplary embodiment, the duration 321 can depend on the relative velocity between the nozzle arrangement 200 and the recording medium 120, in particular on the transport velocity of the recording medium 120. For example, the duration 321 may depend on at what time the nozzle arrangement 200 and the recording medium 120 are displaced relative to one another in order—assuming a first line of the print image—to print a (possibly directly) following second line of the print image. In an exemplary embodiment, the duration 321 depends on the line clock of the printing system 100.

In an exemplary embodiment, the inverse value of a constant duration 321 between two directly successive activation points in time 322, 323 corresponds to the activation frequency of the nozzle arrangement 200. In an exemplary embodiment, the duration 321 may thus indicate how often a nozzle arrangement 200 may be activated to respectively print a pixel. In an exemplary embodiment, at each activation point in time 322, 323 of the sequence of activation points in time 322, 323, an activation of the nozzle arrangement 200 thereby takes place with a defined waveform 311, 312, 313. In an exemplary embodiment, the waveform 311, 312, 313 with which a specific nozzle arrangement 200 should be activated at a specific activation point in time 322, 323 may thereby be indicated by a control data set 331, 332, 333, 334 for this specific activation preparation point in time 322, 323 (and for the specific nozzle arrangement 200).

In an exemplary embodiment, the method 400 additionally includes the determination 402 that the nozzle arrangement 200 should be activated with a first waveform 313 at the first activation point in time 322. In an exemplary embodiment, the method includes the determination 403 that the first waveform 313 is longer than the duration 321. The first waveform 313 is also designated as an overlong waveform in one or more exemplary embodiments.

In an exemplary embodiment, a control data set 333, 334 at the first activation point in time 322 may indicate that the nozzle arrangement 200 should be activated with the first waveform 313. In an exemplary embodiment, the controller 101 and/or the controller 105 can be configured to determine (or have knowledge of) that the first waveform 313 has a time length that exceeds the duration 321, such that the first waveform 313 cannot be executed in the time between two (possibly directly) successive activation points in time 311, 312. In an exemplary embodiment, alternatively or additionally, at a later point in time (e.g., at the second activation point in time 323 that follows (possibly directly or immediately) the first activation point in time 322) it may be determined (e.g., by the controller 101 and/or 105) that the first waveform 313 still has not been completely executed, and thus has a length that exceeds the duration 321. It may thus be determined (e.g., by the controller 101 and/or 105), between the first activation point in time 322 and the second activation point in time 323, that the first waveform 313 is longer than the available duration 321.

In an exemplary embodiment, the method 400 includes the inducement 404 that the activation of the nozzle arrangement 200 with the first waveform 313 is continued at the second activation point in time 323 that follows (possibly directly or immediately) the first activation point in time 322, in particular if the first waveform 313 still persists or still has not yet been completely executed at the second activation point in time 323. An overlong waveform 313 may thus also be executed without disruption.

In an exemplary embodiment, the method 400 enables the new (possibly periodic) activation of the nozzle arrangements 200 with new waveforms 311, 312, 313 as needed for one or more nozzle arrangements 200 of a printing system 100 to be suppressed in order to be able to activate the one or more nozzle arrangements 200 with an overlong waveform 313. The flexibility of the waveforms that are used may thus be increased. In particular, waveforms may thus be used that enable the ejection of particularly large ink droplets (which may be advantageous for the printing of completely inked areas, for example). Due to the fact that the duration 321 may be maintained (i.e. may be kept constant if necessary), and that a periodic activation for one or more individual nozzle arrangements 200 may be interrupted only as needed, the printing of large ink droplets is enabled given an unchanged print speed of the printing system 100.

For example, the first waveform 313 may produce an ejection of an ink droplet having a first droplet size. Moreover, the nozzle arrangement 200 may be configured to be activated with a second waveform 311, 312, wherein the second waveform 311, 312 is shorter (i.e., not longer) than the duration 321 (and thus requires no interruption of the periodic activation of the nozzle arrangement 200). The second waveform 311, 312 may produce an ejection of an ink droplet having a second droplet size, wherein the first droplet size is larger than the second droplet size. The first waveform 313 may thus be used to induce the nozzle arrangement 200 to eject particularly large ink droplets (for example 18 pl or more).

In an exemplary embodiment, the method 400 may include the rastering of an image to be printed to determine print data for the column 310 of the print image. In particular, upon rastering the print data may be determined for a plurality of columns 310 of the print image. For this purpose, a raster grid with a matrix of raster cells may be used. The raster size (i.e. width) of a raster cell transversal to the transport direction thereby depends on the spacing between adjacent nozzle arrangements 200 of the inkjet printing system 100. On the other hand, the raster size (i.e. length) of a raster cell in the transport direction typically depends on the desired density of pixels in the transport direction (and therefore on the available duration 321). The raster cells of a raster grid typically all exhibit a uniform width (transversal to the transport direction). The length (in the transport direction) of the raster cells may depend on the transport velocity and the line clock resulting from this. The length of the raster cells is in particular uniform given a constant transport velocity.

In an exemplary embodiment, the print data for a column 310 (and therefore for a nozzle arrangement 200) may include a sequence of control data sets 331, 332, 333, 334 for the sequence of pixels of a column 310. In an exemplary embodiment, the control data set 331, 332, 333, 334 for a pixel may thereby indicate whether (at the corresponding activation point in time 322, 323) an ink droplet should be ejected from the nozzle arrangement 200 and/or what droplet size the ejected ink droplet should have. In other words: the control data set 331, 332, 333, 334 for a pixel may indicate the waveform 311, 312, 313 with which a nozzle arrangement 200 should be activated at the corresponding activation point in time 322, 323. For this purpose, the control data set 331, 332, 333, 334 for a pixel may comprise a specific bit sequence that indicates a specific waveform 311, 312, 313. This information may be determined within the scope of the rastering process. The nozzle arrangement 200 for a specific column 310 may then be activated at the sequence of activation points in time 322, 323 depending on the determined sequence of control data sets 331, 332, 333, 334 for the specific column 310.

In an exemplary embodiment, the rastering may take place under consideration of the condition that at least one pixel in the sequence of pixels for which no activation of the nozzle arrangement 200 is required (in particular for which no ink ejection by the nozzle arrangement is required) follows a first pixel from the sequence of pixels for which the nozzle arrangement 200 is activated with the first waveform 313 (i.e. with an overlong waveform). In particular, upon rastering, it may be taken into account that a "white" pixel (without ink ejection) must be activated or printed at the printing of a first pixel with the first droplet size in order to enable the complete execution of the first waveform. The optical quality of the print image may be improved via the consideration of this condition in the rastering process.

In an exemplary embodiment, the inducement 404 for the activation of the nozzle arrangement 200 with the first waveform 313 that is continued may include the suppression of the activation of the nozzle arrangement 200 with a new waveform at the second activation point in time 323. In an exemplary embodiment, this suppression may also take place when the print data indicate that the nozzle arrangement 200 should be activated with a new waveform at the second activation point in time 323. In other words: If it is was determined that an overlong waveform 313 should be executed, the activation of the nozzle arrangement 200 with one or more new waveforms may be suppressed until the completed execution of the overlong waveform 313. Overlong waveforms 313 may thus be efficiently enabled.

In an exemplary embodiment, alternatively or additionally, the inducement 404 for the activation of the nozzle arrangement 200 with the first waveform 313 that is continued may include the determination of print data that indicate that the activation of the nozzle arrangement 200 with the first waveform 313 should be continued at the second activation point in time 323. In particular, a specific bit sequence may be reserved in order to indicate that a previously initiated overlong waveform 313 should not be interrupted (meaning that the waveform 313 initiated for a preceding pixel of the sequence of pixels should be continued).

In an exemplary embodiment, the controller 101 and/or controller 105 are configured to activate the nozzle arrangement 200 at a sequence of activation points in time 322, 323 in order to print a corresponding sequence of pixels of a column 310 of a print image in the transport direction on the recording medium 120. In an exemplary embodiment, a time interval between a first activation point in time 322 and a (possibly directly) following second activation point in time 323 thereby corresponds to the sequence of activation points in time 322, 323 of a duration 321. In an exemplary embodiment, the controller 101 and/or controller 105 are configured to determine that the nozzle arrangement 200 should be activated with a first waveform 313 at the first activation point in time 322. In an exemplary embodiment, the controller 101 and/or controller 105 are configured to determine that the first waveform 313 is longer than the duration 321. In an exemplary embodiment, the controller 101 and/or controller 105 are configured to induce the activation of the nozzle arrangement 200 with the first waveform 313 to be continued at the second activation point in time 323, in particular if the first waveform 313 is still present at the second activation point in time 323.

In an exemplary embodiment, the inkjet printing system 100 comprises at least one print head 103 for printing a print image on a recording medium 120, wherein the print head 103 comprises a plurality of nozzle arrangements 200 for printing a corresponding plurality of columns 310 of the print image. Moreover, the inkjet printing system 100 comprises the controller 101 and/or controller 105 that are configured to activate the plurality of nozzle arrangements 200.

In an exemplary embodiment, the controller 101 and/or controller 105 are configured to perform the method 400 and/or control the printing system 100, including one or more components of the printing system 100, to perform the method 400.

An exemplary embodiment includes a computer readable medium that stores instructions, that when executed by the controller 101 and/or controller 105, control the controller 101 and/or controller 105 to perform one or more functions and/or operations of the controllers 101 and/or 105.

CONCLUSION

The aforementioned description of the specific embodiments will so fully reveal the general nature of the disclosure that others can, by applying knowledge within the skill of the art, readily modify and/or adapt for various applications such specific embodiments, without undue experimentation, and without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, "processor circuitry" can include one or more circuits, one or more processors, logic, or a combination thereof. For example, a circuit can include an analog circuit, a digital circuit, state machine logic, other structural electronic hardware, or a combination thereof. A processor can include a microprocessor, a digital signal processor (DSP), or other hardware processor. In one or more exemplary embodiments, the processor can include a memory, and the processor can be "hard-coded" with instructions to perform corresponding function(s) according to embodiments described herein. In these examples, the hard-coded instructions can be stored on the memory. Alternatively or additionally, the processor can access an internal and/or external memory to retrieve instructions stored in the internal and/or external memory, which when executed by the processor, perform the corresponding function(s) associated with the processor, and/or one or more functions and/or operations related to the operation of a component having the processor included therein.

In one or more of the exemplary embodiments described herein, the memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

REFERENCE LIST

100 printing system
101 controller of the printing system 100
102 print head arrangement/print bar
103 print head
104 print head segment
105 controller of a print head arrangement
120 recording medium

200 nozzle arrangement
201 nozzle
202 wall
210 meniscus
212 chamber
220 actuator (piezoelectric element)
221, 222 deflection of the actuator
310 column of a print image
311, 312, 313 waveform
320 line of a print image
321 duration
322, 323 activation point in time
331, 332, 333, 334 control data set for a pixel
400 method to activate a nozzle arrangement
401, 402, 403, 404 method steps

What is claimed is:

1. A method to activate a nozzle arrangement, a recording medium and the nozzle arrangement being moved relative to one another in a transport direction, the method comprising:

activating the nozzle arrangement at a sequence of activation points in time to print a corresponding sequence of pixels of a column of a print image in the transport direction on the recording medium, wherein a time interval between a first activation point in time and a subsequent second activation point in time of the sequence of activation points in time corresponds to a time duration;

determining that the nozzle arrangement should be activated with a first waveform at the first activation point in time;

determining whether the first waveform is longer than the time duration; and inducing the continued activation of the nozzle arrangement with the first waveform at the second activation point in time based on the determination that the first waveform is longer than the time duration.

2. The method according to claim 1, wherein:

the first waveform produces an ejection of an ink droplet with a first droplet size;

the method comprises activating the nozzle arrangement with a second waveform that is shorter than the time duration;

the second waveform produces an ejection of an ink droplet with a second droplet size; and the first droplet size is larger than the second droplet size.

3. The method according to claim 1, wherein:

the method further comprises rastering of an image to be printed to determine print data for the column of the print image; and the rastering is performed such that at least one pixel in the sequence of pixels for which no activation of the nozzle arrangement is required follows a first pixel from the sequence of pixels for which the nozzle arrangement is activated with the first waveform.

4. The method according to claim 3, wherein the non-activation of the nozzle arrangement comprises a non-ejection of ink via the nozzle arrangement.

5. The method according to claim 1, wherein inducing the activation of the nozzle arrangement comprises a suppression of the activation of the nozzle arrangement with a new waveform at the second activation point in time.

6. The method according to claim 5, wherein the suppression of the activation of the nozzle arrangement with the new waveform at the second activation point in time is perform in response to print data that indicates that the nozzle arrangement should be activated with the new waveform at the second activation point in time.

7. The method according to claim 1, further comprising:

determining print data for the column of the print image such that the print data indicates that the activation of the nozzle arrangement with the first waveform is to be continued at the second activation point in time.

8. The method according to claim 7, wherein:

the print data for the column comprise a sequence of control data sets for the sequence of pixels of the column;

the control data set for a pixel indicates:

whether an ink droplet should be ejected by the nozzle arrangement;

a droplet size of the ink droplet to be ejected; and/or whether a waveform initiated for a preceding pixel of the sequence of pixels should be continued; and the method comprises activating the nozzle arrangement at the sequence of activation points in time based on the sequence of control data sets.

9. The method according to claim 7, wherein:

the print data for the column comprise a sequence of control data sets for the sequence of pixels of the column; and the method comprises activating the nozzle arrangement at the sequence of activation points in time based on the sequence of control data sets.

10. The method according to claim 9, wherein a control data set of the sequence of control data sets for a pixel indicates:

whether an ink droplet should be ejected by the nozzle arrangement;

a droplet size of the ink droplet to be ejected; and/or whether a waveform initiated for a preceding pixel of the sequence of pixels should be continued.

11. The method according to claim 1, wherein:

the nozzle arrangement is stationary;

the nozzle arrangement prints precisely one column of the print image in a one-to-one relationship;

the time duration depends on a density of pixels in the transport direction in the print image;

the time duration depends on at what time the nozzle arrangement and the recording medium are displaced relative to one another to print a subsequent second line of the print image;

the time duration depends on a relative velocity between the nozzle arrangement and the recording medium; and/or the time duration between two directly successive activation points in time of the sequence of activation points in time is constant given a constant relative velocity.

12. The method according to claim 11, wherein the relative velocity is a transport velocity of the recording medium.

13. A computer program product embodied on a non-transitory computer-readable medium comprising program instructions, when executed, causes a processor to perform the method of claim 1.

14. A controller of an inkjet printing system configured to perform the method of claim 1.

15. The method according to claim 1, wherein the first activation point in time and the subsequent second activation point in time are consecutive activation points in time of the sequence of activation points in time.

16. The method according to claim 1, wherein the continued activation of the nozzle arrangement with the first waveform at the second activation point in time is based on an activation of the nozzle arrangement at the first activation point in time with the first waveform.

17. An inkjet printing system, comprising:

at least one print head for printing a print image on a recording medium, the at least one print head including a plurality of nozzle arrangements configured to print a corresponding plurality of columns of the print image, wherein the recording medium and the plurality of nozzle arrangements are moved relative to one another in a transport direction; and a controller configured to:

activate a nozzle arrangement of the plurality of nozzle arrangements at a sequence of activation points in time to print a corresponding sequence of pixels of a column of the print image in the transport direction on the recording medium, wherein a time interval between a first activation point in time and a subsequent second activation point in time of the sequence of activation points in time corresponds to a time duration;

determine that the nozzle arrangement should be activated with a first waveform at the first activation point in time;

determine whether the first waveform is longer than the time duration; and induce the continued activation of the nozzle arrangement with the first waveform at the second activation point in time based on the determination that the first waveform is longer than the time duration.

18. A method to activate a nozzle arrangement, a recording medium and the nozzle arrangement being moved relative to one another in a transport direction, the method comprising:

activating the nozzle arrangement at a sequence of activation points in time to print a corresponding sequence of pixels of a print image on the recording medium, wherein a time interval between a first activation point in time and a subsequent second activation point in time of the sequence of activation points in time corresponds to a time duration;

determining a first waveform configured to activate the nozzle arrangement at the first activation point in time;

determining whether the first waveform is longer than the time duration; and inducing the continued activation of the nozzle arrangement with the first waveform at the second activation point in time and suppressing the activation of the nozzle arrangement with a second waveform at the second activation point in time based on the determination that the first waveform is longer than the time duration.

19. A computer program product embodied on a computer-readable medium comprising program instructions, when executed, causes a processor to perform the method of claim 18.

20. A controller of an inkjet printing system configured to perform the method of claim 18.

* * * * *